United States Patent
Buehler et al.

(10) Patent No.: US 10,162,023 B2
(45) Date of Patent: Dec. 25, 2018

(54) APPARATUS FOR REDUCING VIBRATIONS IN A PULSE TUBE REFRIGERATOR SUCH AS FOR MAGNETIC RESONANCE IMAGING SYSTEMS

(71) Applicant: Oxford Instruments Nanotechnology Tools Limited, Abingdon Oxon (GB)

(72) Inventors: Matthias Buehler, Poecking (DE); Theo Hertrich, Abingdon Oxon (GB); John Garside, Witney (GB); Dieter Jedamzik, London (GB)

(73) Assignee: OXFORD INSTRUMENTS NANOTECHNOLOGY TOOLS LIMITED (GB)

( * ) Notice: Subject to any disclaimer, the term of this patent is extended or adjusted under 35 U.S.C. 154(b) by 1013 days.

(21) Appl. No.: 14/403,359

(22) PCT Filed: Apr. 19, 2013

(86) PCT No.: PCT/GB2013/050998
§ 371 (c)(1),
(2) Date: Nov. 24, 2014

(87) PCT Pub. No.: WO2013/175168
PCT Pub. Date: Nov. 28, 2013

(65) Prior Publication Data
US 2015/0108980 A1    Apr. 23, 2015

(30) Foreign Application Priority Data
May 25, 2012  (GB) .................................. 1209243.3

(51) Int. Cl.
*F25B 9/14*  (2006.01)
*G01R 33/34*  (2006.01)

(52) U.S. Cl.
CPC .......... *G01R 33/3403* (2013.01); *F25B 9/145* (2013.01); *F25B 2309/1408* (2013.01); *F25B 2309/1413* (2013.01); *F25B 2500/13* (2013.01)

(58) Field of Classification Search
CPC .................................. F25B 9/14; F25B 9/145
See application file for complete search history.

(56) References Cited

U.S. PATENT DOCUMENTS

| | | |
|---|---|---|
| 2005/0028534 A1 | 2/2005 | Li et al. |
| 2005/0050904 A1 | 3/2005 | Suzuki et al. |

(Continued)

FOREIGN PATENT DOCUMENTS

| | | |
|---|---|---|
| JP | 2003329323 A | 11/2003 |
| JP | 2006275429 A | 10/2006 |

(Continued)

OTHER PUBLICATIONS

I.A. Tanaeva, et al., "A Small Helium-3 Pulse-Tube Refrigerator," Cyrogenics, vol. 45, No. 8, Aug. 1, 2005, pp. 578-584.

*Primary Examiner* — Brian King
(74) *Attorney, Agent, or Firm* — Blank Rome LLP

(57) ABSTRACT

A pulse tube refrigerator (PTR) comprising a pedestal head and a regenerator tube assembly is provided having particular application in cooling a Magnetic Resonance Imaging system. The PTR comprises a pedestal head and at least one cooled stage, the at least one cooled stage being mounted to a distal end, with respect to the pedestal head, of each of an associated regenerator tube and an associated pulse tube, the associated regenerator tube and associated pulse tube together providing pressurized coolant gas to the at least one cooled stage, wherein the associated regenerator tube and the associated pulse tube are elongate along substantially parallel axes; and further arranged, wherein, the displacements of the distal ends of each of the associated regenerator tube and the associated pulse tube in response to the cyclical (Continued)

changes in coolant pressure, are substantially the same when the pulse tube refrigerator is in use.

13 Claims, 3 Drawing Sheets

(56) References Cited

U.S. PATENT DOCUMENTS

2006/0144054 A1    7/2006  Xu et al.
2007/0119190 A1*  5/2007  Yan .......................... F25B 9/145
    62/6
2008/0276626 A1*  11/2008  Xu .......................... F25B 9/145
    62/6

FOREIGN PATENT DOCUMENTS

JP         200875991 A    4/2008
JP         2009293909 A   12/2009

* cited by examiner

APPARATUS FOR REDUCING VIBRATIONS IN A PULSE TUBE REFRIGERATOR SUCH AS FOR MAGNETIC RESONANCE IMAGING SYSTEMS

RELATED APPLICATIONS

This is a national phase of PCT/GB2013/050998, filed Apr. 19, 2013, which claims priority to Great Britain Application No. 1209243.3, filed May 25, 2012. The entire contents of those applications are hereby incorporated by reference.

FIELD OF THE INVENTION

The present invention relates to apparatus for the reduction of vibrations in a pulse tube refrigerator. The invention finds particular advantage when embodied in the cooling system of a Magnetic Resonance Imaging (MRI) system.

BACKGROUND TO THE INVENTION

Low temperature properties such as superconductivity are now widely used in a range of different applications including Magnetic Resonance Imaging (MRI), superconducting magnets, sensors and in fundamental research. Historically, the evaporation of cryogenic liquids such as nitrogen or helium has been used as a cooling mechanism in order to reach the low temperatures required for such applications. Cryogenic liquids, particularly helium, have associated disadvantages in that they are often "consumable" due to incomplete recovery of boiled off gas. Furthermore such apparatus for storing or otherwise handling cryogenic liquids is often bulky and requires special handling procedures. Such apparatus and procedures are somewhat incompatible with patient care environments.

More recently, pulse tube refrigerators (PTRs) have been used to replace cryogenic liquids in providing an alternative refrigeration mechanism. In contrast with the evaporation of cryogenic liquids, PTRs do not rely upon a phase change within the coolant. Instead, PTRs operate upon a principle of using the cooling which is associated with the work of compression and expansion of a working gas coolant such as helium. Accordingly, the use of PTR systems is of particular interest for cooling apparatus for medical applications such as MRI systems.

PTRs provide cooling of a cold stage at relatively modest cooling powers of a few Watts, to temperatures below 4 Kelvin. These low temperatures are produced by expanding and compressing the working gas in a thermodynamic cycle. In order to run the cycle, a typical PTR system comprises three major components—a compressor, a valve assembly and a pedestal part. The compressor supplies the cryocooler with high pressure compressed gas such as helium via a high pressure line, and receives gas back from the cryocooler in a low pressure line. The pedestal part comprises pulse tube(s), regenerator tube(s) comprising different regenerator materials for heat exchange with the incoming and outgoing gas where the cooling power is supplied, and the cooled stage(s) thermally connected to the subject to be cooled. The valve assembly connects the high and low pressure sides of the compressor to the pulse tubes and regenerators within the pedestal part, and controls the timing and distribution of gas flows between the compressor and pedestal part in order to effect the thermodynamic cycle and subsequent cooling.

A major advantage of PTRs is that they have very few moving parts in contrast to alternative refrigerators such as Gifford McMahon coolers, and this makes them particularly beneficial for applications where low levels of vibration noise are needed. Examples of such applications include MRI imaging where, in addition to improving image resolution, there is a desire to reduce vibrations and audible noise since it is well established that many MRI procedures are aborted by patients when they become distressed during such procedures. Furthermore, the vibrations from a PTR cold head which is in close contact with a cryostat may cause cyclical vibrations within the MRI magnetic field. This may adversely affect the quality of the MRI data. Other applications for PTRs include refrigerators going to very low temperatures where vibrations are a source of heat generation and sensitive optical, magnetic or electronic experiments where vibrations disturb the measurements and additional work is required to reduce the vibration levels.

However, the cyclical flow of gas within the pedestal of a PTR produces a large range of pressures within the tubes of the pedestal, typically ranging from approximately 5 bar to 28 bar. These pressure changes cause expansion and contraction of the pedestal tubes due to the elasticity of the construction materials, and these are transferred as vibrations to the cold stage, which can typically be in the range of 10-50 microns.

Attempts to reduce the vibrations of the cold stage have focussed on increasing the rigidity of the tubes in the pedestal. For example, JP-A-2003329323 discloses a two stage PTR where the wall thickness of a second (colder) stage pulse tube is set to be larger than the wall thickness of a first stage pulse tube in order to increase its rigidity. This increase in rigidity decreases the vibration amplitude in the second cold stage.

US-A-2008/0173026 uses a variable wall thickness in the tubes of the pedestal part, with the tubes being thicker at the higher temperature end in order to increase their rigidity and therefore reduce vibration, and thinner at the low temperature end so as to minimise the decrease in cooling performance. The walls are either stepped or continuously sloped from the thicker high temperature part to the thinner low temperature part.

However, due to the importance and widespread use of pulse tube refrigerators, there is a continued need to reduce the vibrations present in such refrigerators.

SUMMARY OF THE INVENTION

In accordance with a first aspect of the present invention there is provided a pulse tube refrigerator comprising a pedestal head and at least one cooled stage, the at least one cooled stage being mounted to a distal end, with respect to the pedestal head, of each of an associated regenerator tube and an associated pulse tube, the associated regenerator tube and associated pulse tube together providing pressurised coolant gas to the at least one cooled stage, wherein the associated regenerator tube and the associated pulse tube are elongate along substantially parallel axes; and further arranged, wherein the displacements of the distal ends of each of the associated regenerator tube and the associated pulse tube, in response to the cyclical changes in coolant pressure, are substantially the same when the pulse tube refrigerator is in use.

Here, "displacement" is a vector quantity, such that the displacements of the distal ends of each of the regenerator tube and pulse tube are equal in both magnitude and direction. Preferably, the displacements are along the elongate axes of the associated pulse tube and associated regenerator tube.

As explained above, the prior art has attempted to reduce vibrations in PTRs by increasing the wall thickness of the pedestal tubes in order to stiffen them, in particular the longer second stage pulse tubes. In contrast, we have discovered that a key parameter causing vibration of a cooled stage in a PTR is the differential expansion, and in particular axial elongation, of its associated pulse tube and regenerator tube. If the pulse and regenerator tubes are elongate along a z-axis, then even a small discrepancy in the z-axis displacements of the tubes can translate into relatively large movement in the x- and y-axis directions, leading to large amplitude vibrations in the cooled stage. The present invention provides a solution to this problem by "balancing" the z-axis elongations of the tubes contributing to the motion of each cooled stage such that vibration is limited to the z-axis only. Z-axis vibrations are significantly smaller in amplitude than x- and y-axis vibrations caused by differential elongation of the pulse and regenerator tubes, and therefore limiting the vibrations to the z-axis advantageously reduces the amplitude of vibrations in the cooled stage. Vibration amplitudes using the present invention have been significantly reduced from 18 microns to less than 5 microns.

Indeed, if the displacements of the regenerator tube and the pulse tube are balanced such that vibrations are in the z-axis direction only, the average wall thicknesses of the tubes have very little significance on the x- and y-axis vibration amplitudes, in contrast to the prior art.

Preferably therefore, the axial elongation responses of the associated regenerator tube and the associated pulse tube for a particular stage is substantially the same as a function of internal pressure, at least within the working pressure range of the PTR when in use.

Typically, for each cooled stage the associated regenerator tube and associated pulse tube are formed from materials having similar mechanical properties, and are preferably formed from the same material. This means that each tube has the same elasticity and it is therefore easier to balance the displacement of the distal ends of the tubes.

The pulse tube refrigerator may comprise first and second cooled stages arranged serially with the second cooled stage being located at a more distal position, with respect to the pedestal head, than the first stage, and wherein the displacement of the distal end of the regenerator tube associated with the second cooled stage comprises the summation of the individual elongations of the regenerator tubes associated with the first and second cooled stages in response to the cyclical changes in coolant pressure. A PTR comprising first and second cooled stages (a two-stage PTR) preferably requires both the first and second cooled stages to be "balanced" in the manner described above. Typically the regenerator tube associated with the second cooled stage has a rigid connection (either directly or indirectly) to the regenerator tube associated with the first cooled stage, meaning that the total displacement of the distal end of the second stage regenerator tube is a function of the individual elongation of the first regenerator tube as well as the individual elongation of the second regenerator tube itself. The pulse tube associated with the second cooled stage with which the second stage regenerator tube is to be balanced typically does not have a rigid connection with any component of the first cooled stage. Therefore, in order to balance the second cooled stage, the individual elongations of both regenerator tubes must be taken into account. Similar considerations are required for PTRs comprising three or more cooled stages.

Typically, the displacement of the distal end of the regenerator tube associated with the second cooled stage further comprises the individual elongation of the first cooled stage. However, this elongation is usually negligible in comparison with that of the regenerator tubes and to a first approximation is ignored.

Preferably, where the pulse tube refrigerator comprises first and second stages arranged serially, the most distal stage with respect to the pedestal head is a coldest stage and wherein, during use, the cyclical displacement of the coldest stage with respect to the pedestal head has a magnitude of less than 5 micrometers.

Although typically the pulse tube associated with the second cooled stage does not have a rigid connection to any component of the first stage, said pulse tube associated with the second stage may alternatively have a mechanical and/or thermal connection with the first cooled stage.

Typically, a proximal end, with respect to the pedestal head, of the regenerator tube associated with the second cooled stage is mounted to the first cooled stage. This provides a rigid connection between the regenerator tubes associated with the first and second stages, meaning that the individual elongations of both regenerator tubes are taken into account when balancing the second cooled stage.

The regenerator tube associated with the first cooled stage and the regenerator tube associated with the second cooled stage are in fluid communication with each other, and typically arranged serially. The regenerator tubes associated with the first and second stages may also be arranged coaxially. However, other arrangements are envisaged, for example the regenerator tubes being aligned along offset parallel axes.

As explained hereinabove, the at least one cooled stage is mounted to a distal end, with respect to the pedestal head, of each of an associated regenerator tube and an associated pulse tube. The distal ends of the tubes may be mounted such that the distal ends are located within the first cooled stage (for example by welding, soldering or gluing), or mounted such that the distal ends are flush to a surface of the first cooled stage. Alternatively each tube may have a different mounting. Mounting the tubes such that the distal end of a tube is situated within the first cooled stage advantageously increases the stiffness of the mounting, which aids in reducing vibrations in the cooled stage. With any of the above mounting arrangements, as long as the displacements of the distal ends of the tubes are substantially the same when the pulse tube refrigerator is in use, then the cooled stage will be "balanced", i.e. vibrations will be substantially limited to the major axes of the tubes.

The pulse tube refrigerator may comprise a first cooled stage having an associated first regenerator tube and first pulse tube, wherein said first regenerator tube has a first free length defined between opposing external surface of the pedestal head and the first stage, and the first pulse tube has a second free length defined between opposing external surfaces of the pedestal head and the first stage. Typically, the first and second free lengths are substantially the same, although alternatively the first cooled stage may be profiled such that the free lengths differ. However, even in the case where the free lengths differ, as long as the displacements of the distal ends of the regenerator and pulse tubes associated with that stage are substantially the same, the stage will be balanced. Any cooled stage within a two or more stage PTR may be profiled.

Each pulse tube and regenerator tube within the PTR is preferably cylindrical, and has an inner radius and an outer radius, with a wall thickness of the tube defined by the difference between the outer and inner radii. Alternatively however, other cross-sectional geometries may be used (such as a diamond shape), as long as the condition is met that the displacement of the distal end of the regenerator tube and the displacement of the distal end of the pulse tube, with respect to the pedestal head, in response to cyclical pressure changes in coolant pressure, is substantially the same when the pulse tube refrigerator is in use.

In a case where the materials having the same elasticity (elastic modulus), the pulse tube and regenerator tube associated with a cooled stage may be manufactured such that the ratio of the square of the inner radius to the difference of the squares of the outer and inner radii is substantially the same for each tube. This condition also assumes that the pressure within each tube at any given time is approximately equal (which is a reasonable approximation in a pulse tube refrigerator). This condition ensures that the axial displacement due to pressurising the tubes in the coolant gas cycle will be the same for each tube associated with a cooled stage, advantageously minimizing the vibration of the at least one cooled stage.

Of course, other parameter conditions may be used to ensure the equal displacements of the distal ends of the tubes associated with a cooled stage, for example if said tubes are made of materials with different elasticity, or if the working pressures are different in different tubes.

We have further realised that for some applications, due to the increasing cooling power of PTRs, the heat load due to thicker tube walls (and therefore increased heat conductivity) is of minor importance in comparison with controlling vibrations, especially where the PTR is a two-stage (or three or more stage) PTR comprising first and second stages arranged serially. In such a PTR the first cooled stage is cooled to a temperature of approximately 30K and the second tube is cooled to the desired target temperature, typically below 10K. The high cooling power of the first stage reduces the effect of the high heat load (a few Watts) at the first stage due to thick tube walls. Secondly, at the very low temperature of the second stage, the heat conductivity of the tube materials is substantially reduced from room temperature values and so again thicker walls are less of an issue. This advantageously means that the present invention does not require the difficult and time-consuming manufacture of tubes with varying thickness walls as seen in the prior art, and the tubes of the present invention preferably have a constant wall thickness along their length (although alternatively sloped or stepped walls may be used). Indeed, the present invention uses a completely different approach from the prior art through the use of balancing the displacement of the tubes along an axis, rather than simply increasing their rigidity.

The pulse tube refrigerators in accordance with the invention find particularly advantageous application and use in the field of magnetic resonance, and in particular, magnetic resonance imaging.

In accordance with a second aspect of the invention, there is provided a magnetic resonance imaging system comprising:
  a magnet system comprising a number of magnets for generating a magnetic field which is suitable for obtaining magnetic resonance signals from a target region;
  a radio frequency system for obtaining radio frequency signals from the target region;
  a control system for controlling the magnetic fields experienced within different parts of the target region in accordance with the magnet system and radio frequency system;
  a processing system for forming an image from the radio frequency signals; and,
  a cooling system adapted in use to cool one or more of the magnet system or radio frequency systems using a pulse tube refrigerator in accordance with the first aspect.

The magnet system typically includes superconductive magnets and wherein the cryogenic cooling system further comprises a heat transfer medium which is arranged to act as a heat sink for the superconductive magnets and wherein the pulse tube refrigerator is operative to extract heat from the heat transfer medium when in use. Such a medium may take the form of a liquid coolant, a gaseous coolant or a solid high thermal conductivity material such as high purity copper.

BRIEF DESCRIPTION OF THE DRAWINGS

An example of an apparatus for reducing vibrations in a cryocooler according to the present invention is now described with reference to the accompanying drawings in which.

DETAILED DESCRIPTION OF THE DRAWINGS

Figure 1:
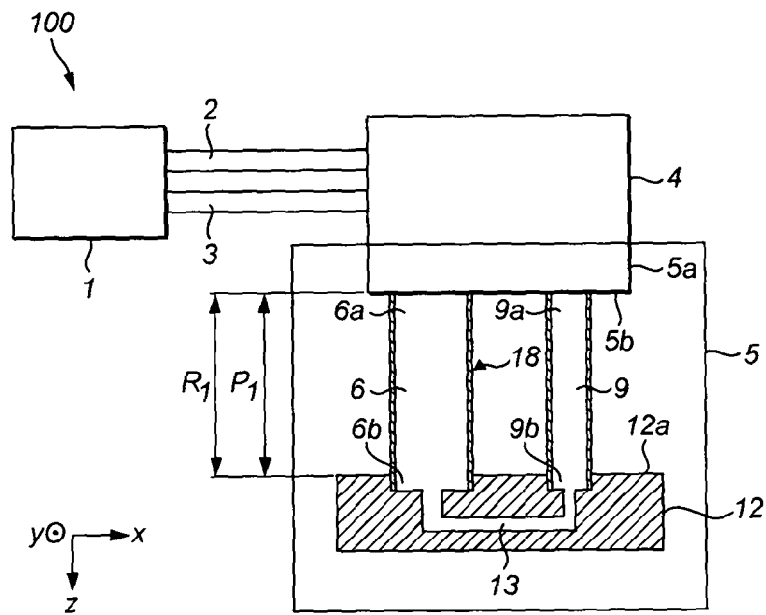
FIG. 1 shows a schematic diagram of a single stage pulse tube refrigerator according to the present invention.

FIG. 1 schematically shows a single stage pulse tube refrigerator (PTR) system 100. The PTR system comprises a compressor 1 (such as a scroll compressor) attached to a valve assembly 4 via a high pressure (HP) supply line 2 and a low pressure (LP) supply line 3. The HP and LP supply lines 2, 3 are flexible pipes capable of withstanding high pressure. In use, a suitable gaseous refrigerant such as helium is supplied from the scroll compressor 1 and fed via the HP supply line 2 to the valve assembly 4 at a high pressure of about 15-35 bar.

The valve assembly 4 comprises a rotary valve (not shown) which is operable to cyclically connect the HP 2 and LP 3 supply lines to the pedestal 5. Although a rotary valve is preferably used, other valves such as solenoid or needle valves with appropriate timing control may also be used. Helium gas is supplied to the pedestal 5 from the HP line 2 and drawn back to the compressor 1 through the low pressure line 3. The pedestal 5 comprises a pedestal head 5a, an elongate regenerator tube 6 and an elongate pulse tube 9 in flow communication with each other through conduit 13. In the view of FIG. 1, the major axes of both the regenerator tube 6 and the pulse tube 9 are along the z axis and are substantially parallel. The regenerator tube 6 forms part of a regenerator assembly 18 which in this case essentially comprises the regenerator tube 6. Conduit 13 connects a low temperature end 6b of the regenerator tube to a low temperature end 9b of the pulse tube, and is contained within a first cooled stage 12 which may be constructed from a high thermal conductivity material such as copper. The low temperature end 6b of the regenerator tube and the low temperature end 9b of the pulse tube are connected into the first cooled stage 12 such that the distal end of the tubes are contained within the first cooled stage 12, providing extra stiffness to the joint between the tubes 6, 9 and the first cooled stage 12. Alternatively, the pulse tube 9 and regenerator tube 6 may be attached to the first cooled stage such that the distal end of each tube is flush to the surface 12a of the first cooled stage 12. A high temperature end 6a of the regenerator tube and a high temperature end 9a of the pulse tube are attached to the pedestal head 5a.

In use, the rotary valve within the valve assembly 4 controls the flow and timing of helium gas into and out of the regenerator tube 6 and the pulse tube 9. This flow and expansion and compression of the helium gas within the pedestal 5 provides cooling of the cooled stage 12, which is in thermal contact with a target to be cooled, for example an arrangement of radiation shields in a cryostat.

Figure 3:
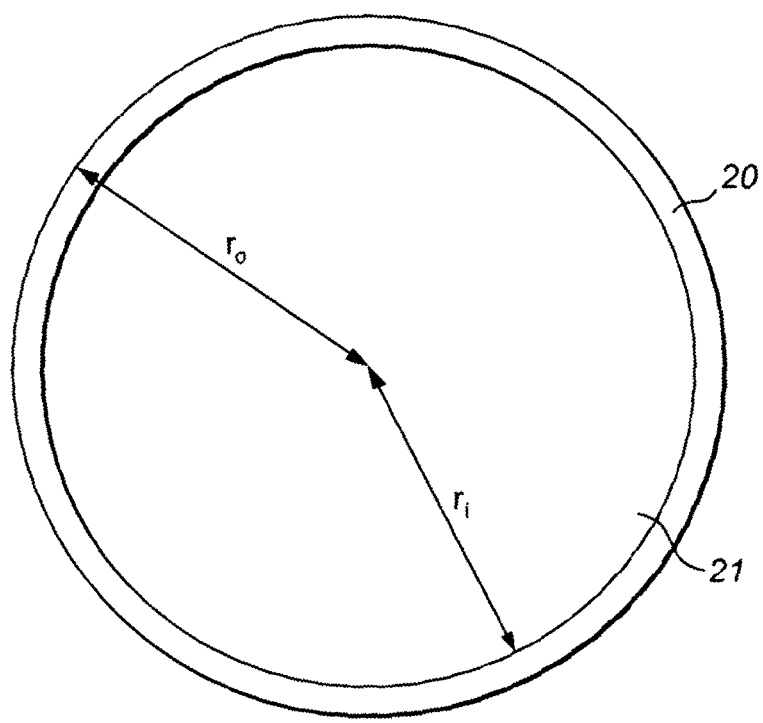
FIG. 3 is a cross-sectional view of a pedestal tube according to the present invention; and, FIG. 4 is a schematic diagram of a magnetic resonance system incorporating a pulse tube refrigerator according to the examples.

Each of the pulse tube 9 and the regenerator tube 6 are cylindrical having a wall 20 defining an inner radius $r_i$ and an outer radius $r_o$ as seen in FIG. 3. $r_i$ and $r_o$ are typically different for the pulse tube 9 and the regenerator tube 6. The walls of the regenerator tube 6 and the pulse tube 9 are typically both constructed from stainless steel. The inner bore 21 (see FIG. 3) of the regenerator tube is filled with regenerative material such as metal (for example stainless steel, bronze, brass, copper, lead or rare earth metal) meshes or granules.

In use, the change in helium gas pressure during its flow cycle through the regenerator and pulse tubes 6, 9 causes expansion and contraction of the length of both the regenerator tube 6 and the pulse tube 9 along the z axis. Referring back to FIG. 1, at a time when the pressure within the regenerator tube 6 and pulse tube 9 is at its lowest amplitude the "free" length of the pulse tube 9 between the opposing surfaces 5b, 12a of the pedestal head 5a and first cooled stage 12, respectively, is $P_1$ and that of the regenerator tube 6 is $R_1$. In this case the free lengths of the pulse tube 9 and regenerator tube 6 are approximately equal such that $P_1=R_1$. At a later time in the cycle when the pressure in each tube is increased from the minimum amplitude, the regenerator tube 6 expands along its major axis (in the z direction) by an amount $\Delta R_1$ and the pulse tube 9 expands along its major axis (in the z direction) by an amount $\Delta P_1$. The pressures in the regenerator tube 6 and the pulse tube 9 are substantially equal at any given time instant. Vibration in the cooled stage 12 can be limited only to the z direction if the elongation of the regenerator tube 6 in the z direction is equal to the elongation of the pulse tube 9 in the z direction for any given time instant, in other words, $$\Delta R_1 = \Delta P_1 \quad \text{(Equation 1)}.$$

Due to the minimal movement of the tubes 6, 9 within the first cooled stage 12, to a first approximation, the elongations $\Delta R_1$ and $\Delta P_1$ are with respect to the free lengths $R_1$ and $P_1$.

With reference to FIG. 3, as the walls 20 of the regenerator tube 6 and the pulse tube 9 are constructed from the same material in this example, the tubes 6, 9 have the same elasticity. Thus if the tubes 6, 9 are each constructed according to the following formula, $$\frac{r_i^2}{r_o^2 - r_i^2} = k, \quad \text{(Equation 2)}$$

where k is a constant and is the same for both tubes exposed to the pressurised gas, the expansion, and in particular the axial elongation, due to pressurising the regenerator tube 6 and the pulse tube 9 will be the same for both tubes. This assumes that the thicknesses of the walls of the pulse tube 6 and regenerator tube 9 are constant along their lengths.

As explained above, FIG. 1 illustrates a first cooled stage 12 with a proximal (with respect to the pedestal head) surface 12a perpendicular to the elongate axes of the regenerator tube 6 and the pulse tube 5 such that $P_1=R_1$. However, this does not necessarily have to be the case, and the first cooled stage 12 may have a profiled geometry such that $P_1 \neq R_1$. Even so, as long as Equation 1 holds, the first cooled stage 12 will be balanced.

Figure 2:
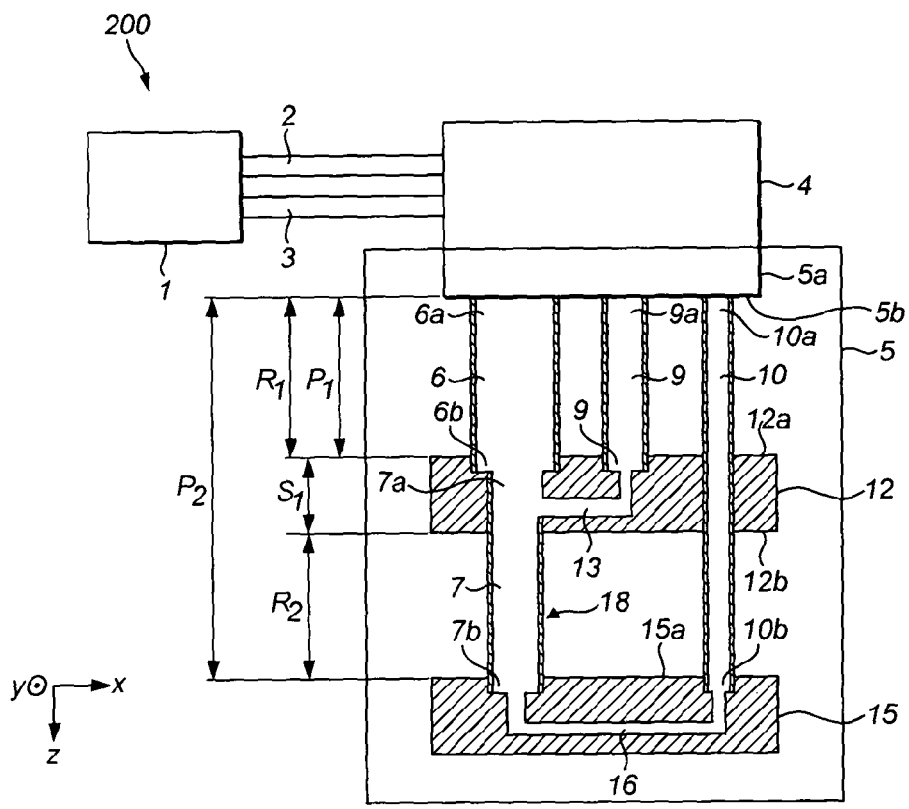
FIG. 2 shows a schematic diagram of a two stage pulse tube refrigerator according to the present invention.

The invention can also be applied to a two-stage PTR system 200, as schematically illustrated in FIG. 2, where like reference numerals to FIG. 1 indicate like parts. The two-stage PTR system 200 is similar to the single stage system 100 and further comprises an elongate second stage regenerator tube 7 having a high temperature end 7a and a low temperature end 7b, and an elongate second stage pulse tube 10 having a high temperature end 10a fixed to the pedestal head 5a and a low temperature end 10b connected into a second cooled stage 15. The high temperature end 7a of the second stage regenerator tube is connected into the first cooled stage 12, and the low temperature end 7b of the second stage regenerator tube is connected into the second cooled stage 15, with the second stage regenerator tube 7 and the second stage pulse tube 10 connected via conduit 16 located within the second cooled stage. The first stage and second stage regenerator tubes 6, 7 are arranged in series and are in flow communication with each other, and conduit 13 in the first cooled stage 12 provides flow communication between the first stage pulse tube 9 and the first stage regenerator tube 6. The major axes of the second stage pulse tube 10 and the second stage regenerator tube 7 are along the z axis and are substantially parallel. The first stage regenerator tube 6 and the second stage regenerator tube 7 together form a regenerator tube assembly 18. The second stage pulse tube 10 extends through an aperture or bore (not shown) in the first cooled stage 12. This aperture or bore has a larger diameter than the outer diameter of the second stage pulse tube 10 such that the second stage pulse tube 10 and the first cooled stage 12 are not in mechanical or thermal contact. In other embodiments, there may be thermal and/or mechanical contact between the second stage pulse tube 10 and the first cooled stage 12.

In the two stage PTR system 200, the first cooled stage 12 is typically at a temperature of approximately 30K, and the second stage tubes 7, 10 provides additional cooling power such that the second cooled stage typically has a temperature below approximately 4K. In other two stage PTR systems 200, the first stage may have a temperature greater than 50K and the second stage may have a temperature greater than 10K.

The second stage regenerator tube 7 and the second stage pulse tube 10 are also cylindrical with a cross-section as illustrated in FIG. 3. The outer diameter of the second stage regenerator 7 is smaller than that of the first stage regenerator 6. The second stage regenerator tube 7 comprises regenerative material such as granules or meshes of stainless steel, bronze, brass, copper, a lead-based alloy or rare earth metals amongst others providing the necessary low temperature thermal capacity for good cooling performance. Using similar nomenclature to that seen in FIG. 1, when the pressure in the gas flow cycle is at a minimum amplitude, the first stage regenerator has a free length $R_1$, the first stage pulse tube has a free length $P_1$, the second stage regenerator tube has a free length $R_2$ defined between opposing faces 12b and 15a of the first and second cooled stages respectively, and the second stage pulse tube has a free length $P_2$ defined between opposing faces 5b, 15a of the pedestal head and second cooled stage respectively. The thickness of the first cooled stage 12 defined between surfaces 12a and 12b is $S_1$, as seen in FIG. 2.

When the pressure in the coolant gas flow cycle is at a minimum amplitude, the free lengths of the first stage pulse tube 9 and first stage regenerator tube 6 are approximately equal such that $P_1=R_1$, and the combined length of the first and second stage regenerators, and the thickness of the first cooled stage is approximately equal to the length of the second stage pulse tube 10 such that $R_1+R_2+S_1=P_2$.

As described above in relation to the single stage PTR system 100, the flow of coolant through the tubes in the pedestal 5, and the change in pressure of the coolant, causes expansion in the z direction of each of the first and second stage pulse tube coolers 9, 10 and each of the first and second stage regenerator tubes 6, 7. The pressure in each of the tubes at a particular time instant is substantially the same, and, since the walls 20 of each cylindrical tube are made of the same material, each tube has the same elasticity. In use, when the helium pressure in the gas flow cycle is increased from the minimum amplitude, the first stage pulse tube expands along the z axis by an amount $\Delta P_1$, the second stage pulse tube expands along the z axis by an amount $\Delta P_2$, the first stage regenerator tube expands along the z axis by an amount $\Delta R_1$ and the second stage regenerator tube expands along the z axis by an amount $\Delta R_2$. In addition, the thickness of the first cooled stage 12 will expand along the z axis by an amount $\Delta S_1$.

In order to limit vibrations in the second cooled stage 15 to the z axis only, the first cooled stage 12 must be balanced by satisfying Equation 1, and the axial elongations of the first and second stage regenerators 6, 7 and the first cooled stage 12 must be matched to the axial elongation of the second stage pulse tube 10. In other words, the condition, $$\Delta R_1+\Delta R_2+\Delta S_1=\Delta P_2 \quad \text{(Equation 3)},$$

together with Equation 1, must be satisfied in order to balance the tubes and limit vibrations in the second cooled stage 15.

Similarly to the above-described single stage PTR system 100, the second cooled stage 15 of a two stage PTR system 200 may be profiled such that $R_1+R_2+S_1 \neq P_2$. However, so long as the conditions of Equations 1 and 3 are both met, the second cooled stage will be "balanced" in the desired manner.

To a first approximation, due to the large thickness of the first cooled stage 12 with respect to the regenerator tube walls, the elongation $\Delta S_1$ of the first cooled platform 12 in the z direction is negligible, and Equation 3 can be simplified to, $$\Delta R_1+\Delta R_2=\Delta P_2 \quad \text{(Equation 4)}.$$

As described above, a two-stage PTR system can be balanced (i.e. vibrations in the first and second cooled stages being limited to the z direction) by simultaneously satisfying Equation 1 and Equation 3. In the simplified case where $P_1=R_1$ and $R_1+R_2=P_2$, $\Delta S_1=0$, and the tubes have the same elasticity, this can be simplified to ensuring that each tube in the PTR satisfies Equation 2, wherein the constant is the same for each tube.

As explained above, in alternative embodiments, there may be thermal and/or mechanical contact between the second stage pulse tube 10 and the first cooled stage 12. In the case where there is a mechanical link between the second stage pulse tube 10 and the first cooled stage 12, the displacements of the distal ends of each of the first regenerator tube 6, first pulse tube 9 and the upper section of the second pulse tube 10 situated between the pedestal head 5a and the first cooled stage 12, must be substantially the same in order for the first cooled stage to be balanced.

Although the invention has been described in relation to a single stage PTR system 100 and a two stage PTR system 200, the invention can also be applied to a PTR system with three or more stages.

It will be appreciated that the components shown in the figures are illustrated schematically and therefore other ordinary equipment which is not specifically shown, such as additional rotary valve ports and conduits, rotary valve biasing mechanisms, tuning valves, impedances, additional pulse tube and regenerator stages, safety valves, oil separators, filters, heat exchangers, sensors and so on, is nevertheless present.

Application to Magnetic Resonance Imaging Systems

Figure 4:
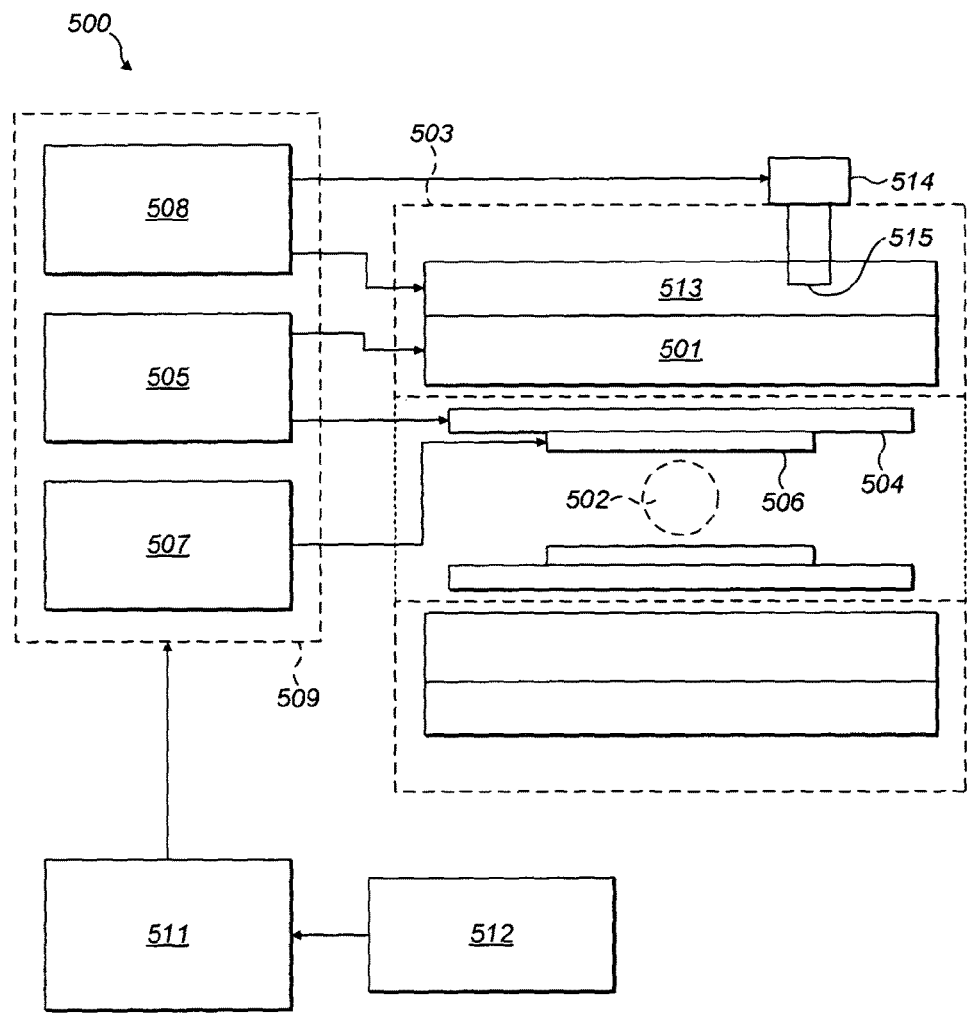

FIG. 4 illustrates an example application of the PTR coolers in providing cooling power to a magnetic resonance imaging system. The magnetic resonance imaging system 500 includes a primary magnet system 501. The primary magnet system 501 includes a main field magnet arranged in the form of superconducting coils wound on a former in a solenoid arrangement. It will be understood that other magnets are present within the system for ensuring magnetic field correction, including shimming magnets, to ensure that the magnetic field generated within a target region of interest 502 within the centre of the solenoid arrangement is sufficiently highly homogeneous in order to produce highly spatially resolved signals. In a medical environment, part of the body of a patient to be investigated is positioned within this target region 502. When in use, the superconducting coils are maintained below their superconducting transition temperature by placing them in thermal contact with a heat sink of some kind, and ensuring they are held in a cryostat 503 which provides a highly thermally insulated environment.

According to the principles of MRI, the spatial information from within the target region is obtained by analysing radio-frequency (RF) signals received from material within the target region when such a region is subjected to magnetic field gradients. The magnetic field gradients are generated by gradient field coils 504 under the control of a magnet controller 505 which controls the gradient field coils 504 and the primary magnetic field system 501. The gradient coils produce magnetic field gradients in three orthogonal directions using resistive magnets since the field strength required is much lower. It is advantageous to place the gradient field coils 504 close to the target region and therefore within the solenoid bore. Similarly, an RF transmitter/receiver 506, which transmits and receives radio frequency signals from the target region is advantageously placed close to the target region 502, again, as shown in FIG. 4, within the solenoid bore. The transmitter/receiver 506 is controlled using and RF controller 507. A cooling system controller 508 controls the cooling of each cooled component of the MRI system 500, such as the primary magnetic field system. The magnet controller 505, RF controller 507 and cooling system controller 508 are in turn each operated as part of a system controller 509.

As will be understood by those of ordinary skill in the art, the formation of meaningful imaging data from the RF signals received from the target region under the respective gradient conditions requires advanced and substantial computational resources. These are provided within the present example system by the image acquisition and processing system 511. The example system in practice will include other components and apparatus, for example including patient monitoring, safety monitoring, data storage and more. Each is not shown in FIG. 4 although will be understood to be present. The skilled operator of the MRI system controls the system through the user interface 512. As will be understood, the controllers and other apparatus described above are generally implemented using computer software and electronics.

We turn now to the cooling system itself which is shown at 513 in FIG. 4, this being under the operational control of the cooling system controller 508. As an example of an implementation of the cooling system 513, the magnetic field coils of the superconducting primary magnet system 501 are placed in contact with a heat sink by being surrounded by liquid cryogen such as helium-4. In a practical implementation of a high-temperature superconductor used for the primary magnet windings, then the coolant could be a different liquid such as nitrogen. In the present example the low temperature superconducting coils are immersed within a reservoir forming part of the cooling system 513. The liquid cryogen absorbs heat over time and this causes boil-off into a head space within an upper region of the cooling system 513. The cooling system 513 provides cooling power through the use of a PTR of the form discussed earlier, namely having a reduced vibrational capability due to the specific design of the tubes within the PTR. The PTR is shown at 514. In this case a two stage PTR is used and the first (higher temperature) stage is connected to radiation shield provided within the cryostat. The second stage, shown at 515, is positioned within the interior of the reservoir within the head space mentioned above. Thus, the gaseous boiled-off helium is recondensed by the second stage of the PTR (since its operational temperature is below the condensation point of the liquid helium) and the liquid helium is returned to the reservoir to provide further cooling. In this manner the system may be used in a "lossless" state whereby effectively no helium is lost from the system during operation, since all helium which is boiled-off is ultimately recondensed by the PTR.

As cryocoolers, such as PTRs, improve over time in terms of their cooling power it is becoming possible to reduce the amount of cryogen needed to ensure reliable operation of superconducting magnets. For example rather than immerse the material in a bath of effectively static fluid it is conceivable to use an externally pumped circuit to provide flowing cryogen so as to cool the superconductor. This causes technical challenges in terms of engineering such a flow path which provides sufficient heat sinking of all parts of the magnet. Furthermore, whilst liquid coolant may be preferred, it is possible, particularly for high temperature superconductors, to consider gaseous cooling (since the superconducting transition temperature is above the boiling point of the liquid cryogen). A cooling system embodying such a pumped flow path, where part of the flow circuit is cooled using a cryocooler, is contemplated as an alternative example cooling system 513.

At the forefront of such developments is the desire to deliver the cooling power directly from a cryocooler to the magnet coils using conductive cooling through a solid high thermal conductivity material, rather than use cryogenic fluids. Some such designs have been proposed and in these cases it is particularly important to provide a close approach between the cooled stage of the cryocooler, such as PTR stage 515, and the superconducting material. In principle this may also be achieved using the cooling system 513. It may be necessary in practice to provide multiple instances of the cryocooler such as PTR 514 in the above examples, particularly in the conductive cooling case here.

In each of the above examples of providing cooling power to the superconducting material there is advantage in providing the PTR within a short distance from the material to be cooled. This reduces the volumes of coolant required, the additional sources of heat input and the overall cost. However, the operation of the PTR in the above example may cause small but significant movements in the magnetic field coils due to vibration. It will therefore be appreciated that by use of a PTR according to the present invention having improved vibration and noise performance, provides a significant advantage when implemented in an MRI system.

Whilst the above discussion is focussed upon the cooling of the primary magnet system 501, it has been proposed that cryocoolers may be useful in the cooling of other parts of an MRI system. For example, it has been proposed that an RF transmitter/receiver system may be implemented using coils which are cooled. These may be implemented as superconducting coils in which case they require to be cooled below their superconducting transition temperature. The improved PTR systems discussed herein may also be used to advantage in the cooling of such coils (either resistive or superconducting), for example by cooling a flow path of circulating coolant which may be at cryogenic temperature.

The invention claimed is:

1. A pulse tube refrigerator comprising a pedestal head and a first cooled stage, the first cooled stage being mounted to a distal end, with respect to the pedestal head, of each of a first regenerator tube and a first pulse tube, the first regenerator tube and first pulse tube together providing pressurized coolant gas to the first cooled stage, wherein the first regenerator tube and the first pulse tube are elongate along substantially parallel axes, wherein each tube has an inner radius and an outer radius, and wherein the ratio of the square of the inner radius to the difference of the squares of the outer and inner radiuses, is substantially the same for each tube;

wherein the displacements of the distal ends of each of the first regenerator tube and the first pulse tube along the substantially parallel axes, in response to the cyclical changes in coolant pressure, are substantially the same when the pulse tube refrigerator is in use.

2. A pulse tube refrigerator according to claim 1, wherein the first regenerator tube and the first pulse tube are formed from materials having similar mechanical properties.

3. A pulse tube refrigerator according claim 1, wherein the first regenerator tube and the first pulse tube are formed from the same material.

4. A pulse tube refrigerator according to claim 1, comprising a second cooled stage arranged serially with the first cooled stage, the second cooled stage being located at a more distal position, with respect to the pedestal head, than the first cooled stage, the second cooled stage connected to the first cooled stage by a second regenerator tube and a second pulse tube, wherein the displacement of the distal end of the second regenerator tube along the substantially parallel axes comprises the summation of the individual elongations of the first and second regenerator tubes in response to the cyclical changes in coolant pressure.

5. A pulse tube refrigerator according to claim 4, wherein the displacement of the distal end of the second regenerator tube with respect to the pedestal head further comprises the individual elongation of the first cooled stage.

6. A pulse tube refrigerator according to claim 4, wherein a proximal end, with respect to the pedestal head, of the second regenerator tube is mounted to the first cooled stage.

7. A pulse tube refrigerator according to claim 4, wherein the first regenerator tube and the second regenerator tube are in fluid communication with each other.

8. A pulse tube refrigerator according to claim 4, wherein the first regenerator tube and the second regenerator tube are arranged serially.

9. A pulse tube refrigerator according to claim 4,
wherein said first regenerator tube has a first free length defined between opposing external surface of the pedestal head and the first cooled stage, and the first pulse tube has a second free length defined between opposing external surfaces of the pedestal head and the first cooled stage,
and wherein said first and second free lengths are substantially the same.

10. A pulse tube refrigerator according to claim 4, wherein the second cooled stage is a coldest stage and wherein, during use, the cyclical displacement of the coldest stage with respect to the pedestal head has a magnitude of less than 5 micrometers.

11. A pulse tube refrigerator according to claim 4, wherein the wall thickness of each tube is in excess of 1 millimeter.

12. A magnetic resonance system comprising:
a magnet system comprising a number of magnets for generating a magnetic field which is suitable for obtaining magnetic resonance signals from a target region;
a radio frequency system for obtaining radio frequency signals from the target region;
a control system for controlling the magnetic fields experienced within different parts of the target region in accordance with the magnet system and radio frequency system;
a processing system for forming an image from the radio frequency signals; and,
a cooling system adapted in use to cool one or more of the magnet system or radio frequency systems using a pulse tube refrigerator in accordance with claim 1.

13. A magnetic resonance system according to claim 12, wherein the magnet system includes superconductive magnets and wherein the cooling system further comprises a heat transfer medium which is arranged to act as a heat sink for the superconductive magnets and wherein the pulse tube refrigerator is operative to extract heat from the heat transfer medium when in use.

* * * * *